United States Patent
Wong

(10) Patent No.: US 8,045,925 B2
(45) Date of Patent: Oct. 25, 2011

(54) WIRELESS COMMUNICATION SYSTEM AND INTERMEDIATE FREQUENCY SIGNAL LOSS COMPENSATION CIRCUIT THEREOF

(75) Inventor: Kwo-Jyr Wong, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 572 days.

(21) Appl. No.: 12/191,273

(22) Filed: Aug. 13, 2008

(65) Prior Publication Data

US 2009/0298434 A1    Dec. 3, 2009

(30) Foreign Application Priority Data

Jun. 2, 2008    (CN) .......................... 2008 1 0301925

(51) Int. Cl.
*H04B 1/00* (2006.01)

(52) U.S. Cl. .................. 455/63.1; 455/114.3; 455/234.1; 375/345

(58) Field of Classification Search ............... 455/63.1, 455/114.2, 114.3, 128, 129, 232.1, 234.1, 455/255–260, 338–341; 375/345
See application file for complete search history.

(56) References Cited

U.S. PATENT DOCUMENTS

| | | | |
|---|---|---|---|
| 2005/0276359 A1* | 12/2005 | Xiong | 375/345 |
| 2007/0141982 A1* | 6/2007 | Bargroff et al. | 455/12.1 |
| 2008/0207138 A1* | 8/2008 | Aoki et al. | 455/75 |
| 2009/0121790 A1* | 5/2009 | Brown et al. | 330/279 |

* cited by examiner

*Primary Examiner* — Nhan Le
(74) *Attorney, Agent, or Firm* — Altis Law Group, Inc.

(57) ABSTRACT

An exemplary intermediate frequency (IF) signal loss compensation circuit for an outdoor unit of a communication system includes a sending circuit, a detection circuit, a receiving circuit, and a control circuit. The detection circuit detects in substantially real-time the loss of signal transmitted via a cable from the indoor to the outdoor unit, and transmits loss signal to the control circuit. The control circuit compares the loss signal with a pre-stored signal to determine the loss and then, the control circuit gives loss signals of the sending circuit a variable gain compensation according to the loss. The control circuit also gives loss signals of the receiving circuit a variable gain compensation in advance. The IF signal loss compensation circuit can detect the IF signal loss in substantially real-time, giving the IF signal a variable gain compensation for the loss.

13 Claims, 3 Drawing Sheets

WIRELESS COMMUNICATION SYSTEM AND INTERMEDIATE FREQUENCY SIGNAL LOSS COMPENSATION CIRCUIT THEREOF

BACKGROUND

1. Field of the Invention

Embodiments of the present disclosure relate to an intermediate frequency (IF) signal loss compensation circuit, and particularly to an IF signal loss compensation circuit in an outdoor unit of a communication system.

2. Description of Related Art

Communication systems comprises transmitting signals between a transmitter and a receiver. The signals may be transmitted wirelessly or through a cable. However, there may be IF signal loss between the transmitter and the receiver when transmitting a signal via the cable.

Referring to FIG. 2, one such communication system includes an outdoor unit 20 and an indoor unit 60. The outdoor unit 20 is connected to the indoor unit 60 via a cable 40, and to an antenna 10. The cable 40 transmits IF signals and control signals between the outdoor unit 20 and the indoor unit 60. Due to loss during IF signals transmitted via the cable 40 or other devices, IF signals are attenuated, and as a result, there is a need to compensate for the IF signals loss in the cable.

Referring to FIG. 3, one such IF signal loss compensation circuit in the outdoor unit 20 includes an up converter 22, a sending amplifier 24, a down converter 26, a receiving amplifier 28, and an IF splitter 30. When the indoor unit 60 receives signals from the outdoor unit 20, radio frequency (RF) signals received from the antenna 10 are sent to the down converter 26 and is converted into IF signals, wherein the IF signals are amplified by the receiving amplifier 28 and is sent to the indoor unit 60 via the IF splitter 30. While the indoor unit 60 sends signals to the outdoor unit 20, the IF signals from the indoor unit 60 are sent to the sending amplifier 24 via the IF splitter 30 to be amplified, and then are sent to the up converter 22 and converted into RF signals. The RF signals are sent to the antenna 10. In this communication system, the sending amplifier 24 and the receiving amplifier 28 are fixed gain amplifiers and can only give IF signals loss a fixed gain compensation. Moreover, the fixed gain amplifiers cannot detect the IF signals loss in substantially real-time, consequently giving IF signals loss a variable gain compensation according to the loss.

What is needed, therefore, is an compensation circuit to remedy the above mentioned deficiencies.

DETAILED DESCRIPTION

Figure 1:
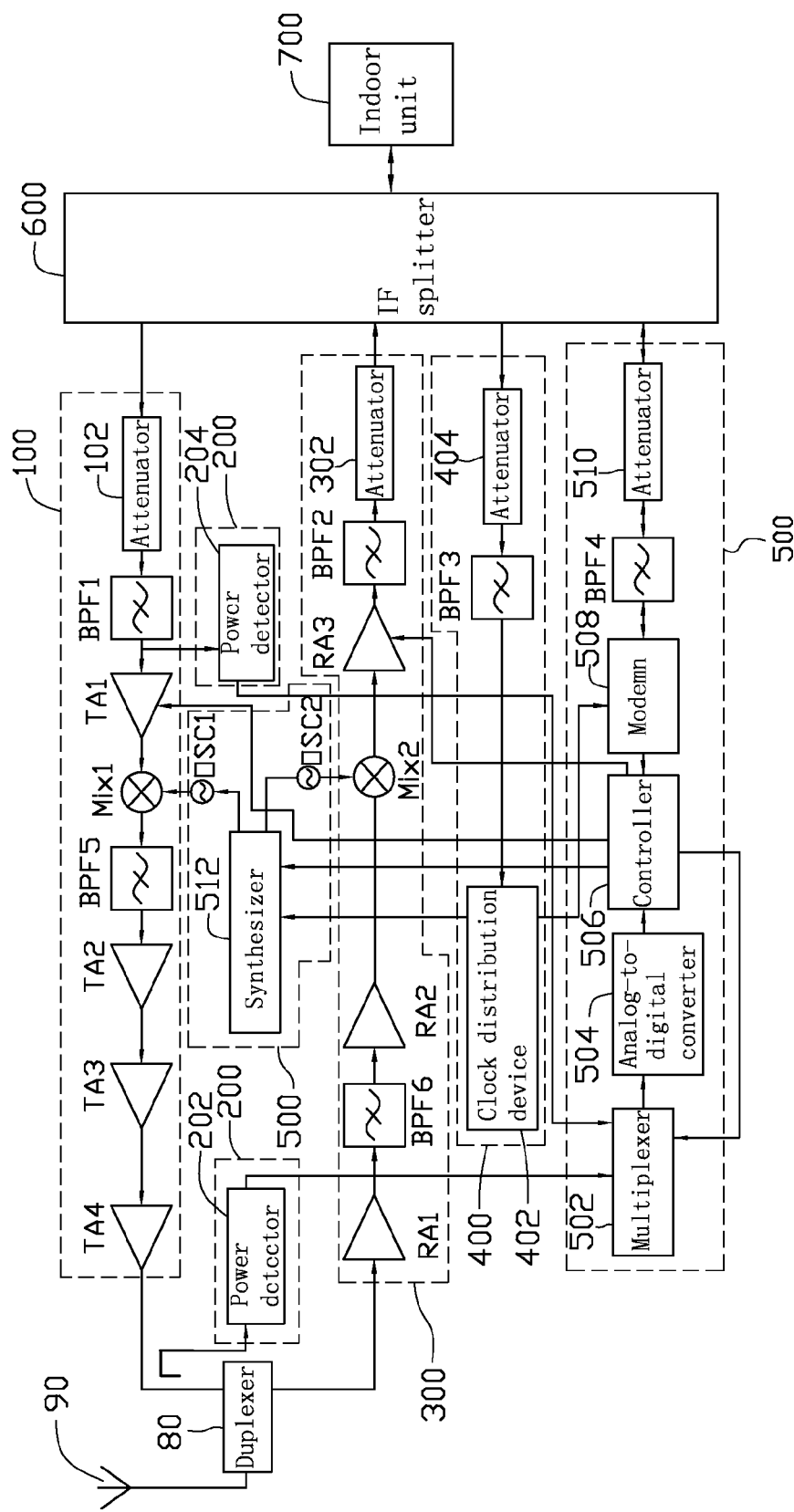
FIG. 1 is an IF signal loss compensation circuit in accordance with an embodiment of the present invention.
Figure 2:
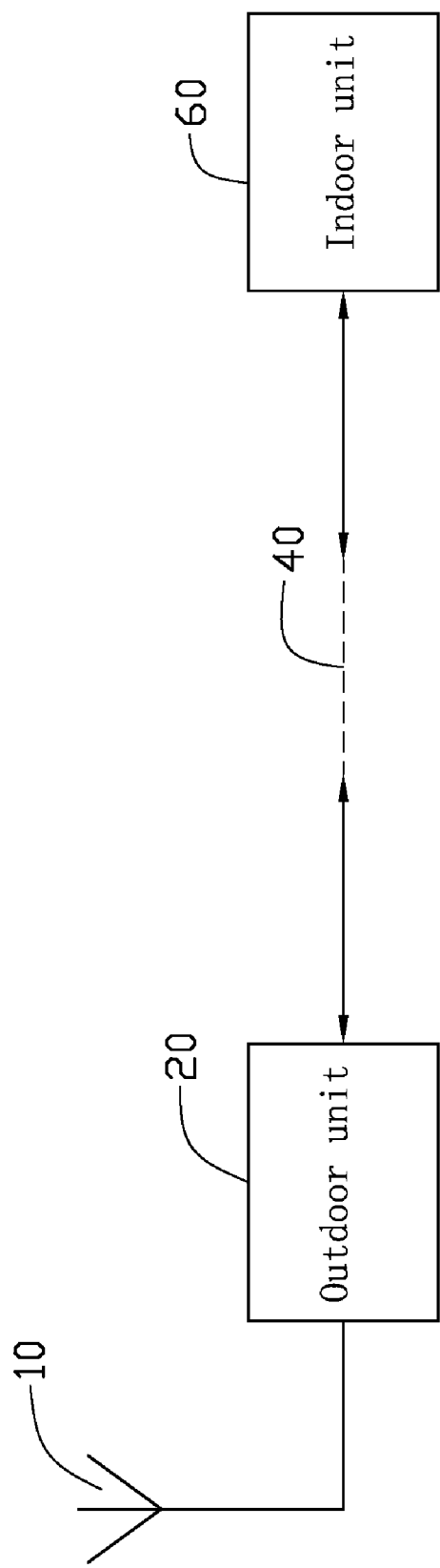
FIG. 2 is a block diagram of a communication system between an outdoor unit and an indoor unit of the prior art.
Figure 3:
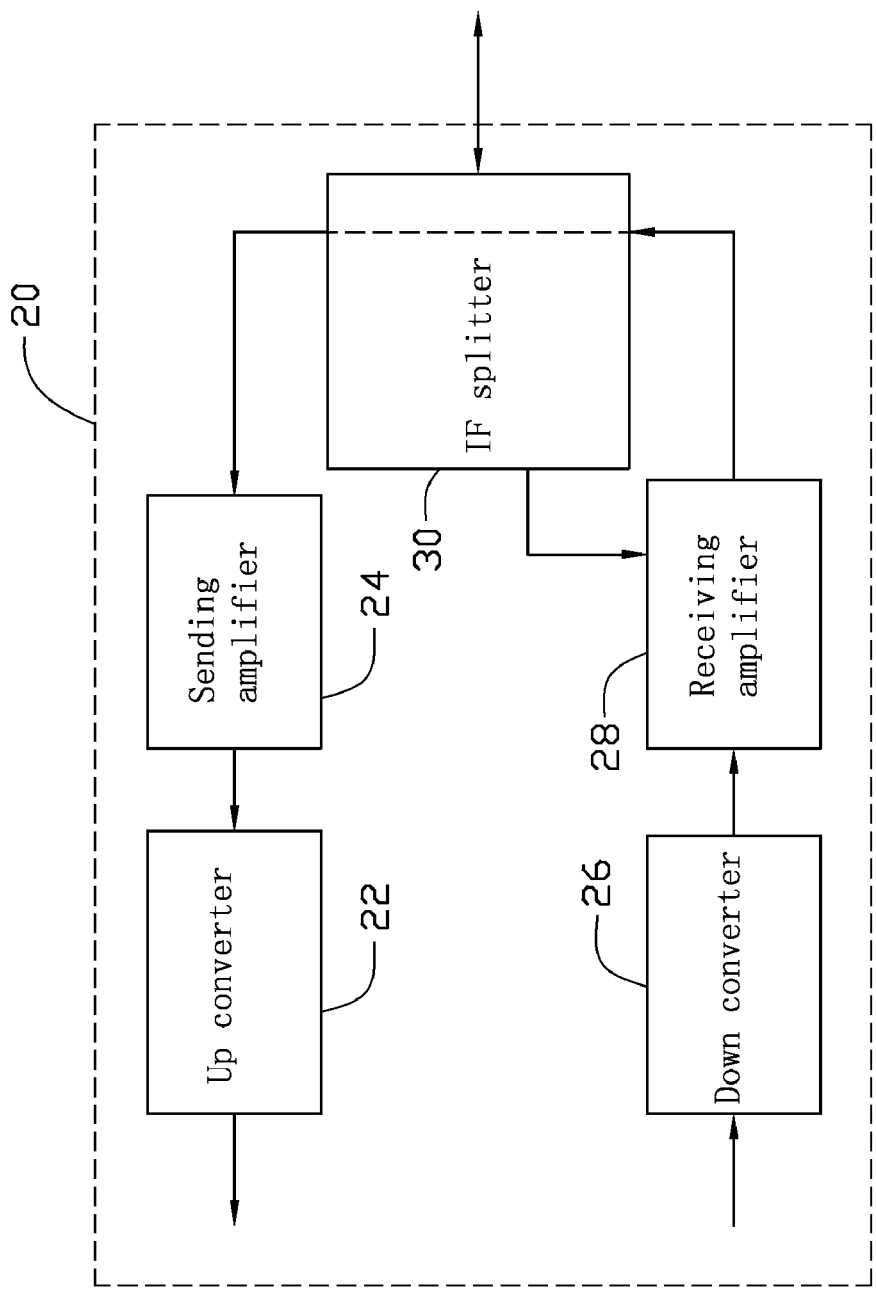
FIG. 3 is a block diagram showing an IF signal loss compensation circuit of the prior art.

Referring to FIG. 1, an IF signal loss compensation circuit mounted in an outdoor unit of a communication system includes a duplexer 80, a sending circuit 100, a detection circuit 200, a receiving circuit 300, a clock circuit 400, a control circuit 500, and an IF splitter 600. In one embodiment, the outdoor unit may be a base station of a network communication system, and the indoor unit may be a hub of the network communication system.

In one embodiment, the sending circuit 100 includes four sending power amplifiers TA1, TA2, TA3, TA4, two band pass filters BPF1, BPF5, a mixer Mix1, and an attenuator 102. The detection circuit 200, in one embodiment, includes two power detectors 202, 204. The receiving circuit 300, in one embodiment, includes three receiving power amplifiers RA1, RA2, RA3, two band pass filters BPF2, BPF6, a mixer Mix2, and an attenuator 302. In one embodiment, the clock circuit 400 includes a band pass filter BPF3, an attenuator 404, and a clock distribution device 402. The control circuit 500, in one embodiment, includes a multiplexer 502, an analog-to-digital converter 504, a controller 506, a modem 508, a band pass filter BPF4, an attenuator 510, a synthesizer 512, and two oscillators OSC1, OSC2.

A first end of the duplexer 80 is connected to an antenna 90, and a second end of the duplexer 80 is connected to the IF splitter 600 via the sending power amplifier TA4, TA3, TA2, the band pass filter BPF5, the mixer Mix1, the sending power amplifier TA1, the band pass filter BPF1, and the attenuator 102 of the sending circuit 100 in series. A third end of the duplexer 80 is connected to the IF splitter 600 via the receiving power amplifier RA1, the band pass filter BPF6, the receiving power amplifier RA2, the mixer Mix2, the receiving power amplifier RA3, the band pass filter BPF2, and the attenuator 302 of the receiving circuit 300 in series. The clock distribution device 402 of the clock circuit 400 is connected to the IF splitter 600 via the band pass filter BPF3 and the attenuator 404. The multiplexer 502 of the control circuit 500 is connected to the IF splitter 600 via the analog-to-digital converter 504, the controller 506, the modem 508, the band pass filter BPF4, and the attenuator 510. The multiplexer 502 is also connected to the controller 506. The controller 506 is connected to the sending power amplifier TA1, the receiving power amplifier RA3, and the synthesizer 512. The modem 508 is also connected to the clock distribution device 402. One end of the oscillator OSC1 is connected to the mixer Mix1, while the other end of the oscillator OSC1 is connected to the clock distribution device 402 via the synthesizer 512. The synthesizer 512 is also connected to the mixer Mix2 via the oscillator OSC2. One end of the power detector 204 of the detection circuit 200 is connected to the multiplexer 502, while the other end of the power detector 204 is connected to a node between the sending power amplifier TA1 and the band pass filter BPF1. One end of the power detector 202 is connected to the multiplexer 502, while another end of the power detector 202 receives the coupled RF signals from a coupler (not shown). The coupler receives signals from the power amplifier TA4.

When the indoor unit 700 sends signals to the outdoor unit, the IF splitter 600 picks up the IF signals from the indoor unit 700. The attenuator 102 matches the IF signals to the sending circuit 100. The band pass filter BPF1 filters out signals other than IF signals. The sending power amplifier TA1 amplifies the IF signals. The mixer Mix1 converts the IF signals into RF signals. The band pass filter BPF5 filters out signals other than RF signals. The RF signals amplified by the amplifiers TA2, TA3, TA4 are sent to the duplexer 80. The duplexer 80 identifies the RF signals and sends the RF signals to the antenna 90.

When the indoor unit 700 receives signals from the outdoor unit, RF signals are sent to the duplexer 80 via the antenna 90. The duplexer 80 identifies and sends the RF signals to the receiving power amplifier RA1, RA2 of the receiving circuit 300 to be amplified. The band pass filter BPF6 filters out signals other than the RF signals. The mixer Mix2 converts the RF signals into IF signals. The IF signals are amplified by the receiving power amplifier RA3. The band pass filter BPF2 filters out signals other than the IF signals. The attenuator 302 matches the IF signals to the IF splitter 600 and sends the IF signals to the IF splitter 600. The IF splitter 600 picks up and sends the IF signals to the indoor unit 700.

Signals are attenuated due to loss during the transmission of signals through various devices, and the loss is particularly significant during the transmission of signals via cables between the indoor unit 700 and the outdoor unit. The detection circuit 200 can detects the IF signals loss in substantially real-time so as to control the sending circuit 100 and the receiving circuit 300 giving the IF signals a variable gain compensation in accordance with the loss. For example, if the size of the loss is 50 w, then the size of the gain compensation will be set 50 w.

In one exemplary example, the following flow depicts one process of a loss compensation using the IF signal loss compensation circuit of the present disclosure. The power detector 204 of the detection circuit 200 detects IF signals output from the band pass filter BPF1 in substantially real-time and sends the IF signals to the multiplexer 502 of the control circuit 500. Subsequently, the IF signals are sent to the analog-to-digital converter 504 to be converted into digital signals. The digital signals are sent to the controller 506, wherein the controller 506 compares the digital signals to pre-stored signals to control a magnification of the sending power amplifier TA1. The sending power amplifier TA1 gives the IF signals a variable gain amplification in accordance with the loss, and as a result, the sending circuit 100 accomplishes a first variable gain compensation for the IF signals loss. Specifically, signal loss is compensated while signals are transmitted from the indoor unit 700 to the outdoor unit via a cable.

Since IF signals loss mainly occurs in the cable, the gain magnification of the IF signals transmitted from the outdoor unit to the indoor unit 700 via the cable is equal to that of the IF signals transmitted from the indoor unit 700 to the outdoor unit via the cable. The controller 506 can also control the receiving power amplifier RA3, thereby giving the IF signals a variable gain amplification according to the loss in advance, in addition to controlling IF signals loss equal to gain magnification during the transmission of IF signals from the indoor unit 700 to the outdoor unit via the cable. As a result, the receiving circuit 300 also gives a first variable gain compensation for the IF signals loss.

In addition, the power detector 202 of the detection circuit 200 also detects RF signals coupled from the sending power amplifier TA4 in substantially real-time and sends the RF signals to the multiplexer 502 of the control circuit 500. The analog-to-digital converter 504 converts the RF signals into digital signals and sends the digital signals to the controller 506. The controller 506 controls the IF signals of the sending power amplifier TA1 and the receiving power amplifier RA3 for a gain compensation in advance, and IF signals accomplish a second variable gain compensation according to the loss. During the transmission of signals, the band pass filter BPF4 of the control circuit 500 is configured for filtering, the attenuator 510 of the control circuit 500 is configured for signals matching, the synthesizer 512 is configured for receiving different frequency signals and sending the signals to the mixer Mix1 and mixer Mix2 via the oscillation OSC1, OSC2, and the oscillations OSC1, OSC2 are configured for voltage conversion. The clock distribution device 402 of the clock circuit 400 is configured for rational allocation of clock signals, the band pass filter BPF3 filters out signals other than clock signals, and the attenuator 404 matches the clock signals to the clock circuit 400.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skill in the art to which the present disclosure pertains without departing from its spirit and scope. Accordingly, the scope of the present disclosure is defined by the appended claims rather than the foregoing description and the exemplary embodiments described therein.

What is claimed is:

1. An intermediate frequency (IF) signal loss compensation circuit for an outdoor unit of a network communication system, comprising:

a sending circuit connected to an antenna of the network communication system, wherein the sending circuit is connected to the indoor unit of the network communication system through a cable and receives an IF signal from an indoor unit through the cable;

a receiving circuit connected to the antenna of the network communication system, wherein the receiving circuit is connected to the indoor unit of the network communication system through the cable;

a detection circuit detecting the IF signal received by the sending circuit in substantially real-time; and a control circuit determining signal loss in the cable by comparing the IF signal detected by the detection circuit with a pre-stored signal corresponding to the IF signal, and compensates the signal loss in the cable in substantially real-time by varying gain amplifications of the sending circuit and the receiving circuit according to the determined signal loss in the cable.

2. The IF signal loss compensation circuit as claimed in claim 1, wherein the sending circuit comprises a first attenuator, a first band pass filter, a first sending power amplifier, a first mixer, a second band pass filter, second, third and fourth sending power amplifiers connected in series; the first attenuator is connected to the indoor unit via an IF splitter of the outdoor unit, and the fourth sending power amplifier is connected to the antenna via a duplexer of the outdoor unit.

3. The IF signal loss compensation circuit as claimed in claim 2, wherein the receiving circuit comprises a first receiving power amplifier, a third band pass filter, a second receiving power amplifier, a second mixer, a third receiving power amplifier, a fourth band pass filter, and a second attenuator connected in series; the second attenuator is also connected to the indoor unit via the IF splitter of the outdoor unit, and the first sending power amplifier of the sending circuit is connected to the antenna via the duplexer of the outdoor unit.

4. The IF signal loss compensation circuit as claimed in claim 3, wherein the control circuit comprises a synthesizer, first and second oscillators, a multiplexer, an analog-to-digital converter, a controller, a modem, a fifth band pass filter, and a third attenuator connected in series; the third attenuator is also connected to the indoor unit via the IF splitter of the outdoor unit, the multiplexer is also connected to the controller, the controller is also connected to the first sending power amplifier of the sending circuit, the third receiving power amplifier of the receiving circuit and the synthesizer; one end of the first oscillator is connected to the first mixer of the sending circuit, and another end of the first oscillator is connected to the synthesizer, wherein the synthesizer is also connected to the second mixer of the receiving circuit via the second oscillator.

5. The IF signal loss compensation circuit as claimed in claim 4, wherein the detection circuit comprises a first power detector and a second power detector; one end of the first power detector is connected to the multiplexer of the control circuit, another end of the first power detector is connected to a node between the first sending power amplifier and the first band pass filter of the sending circuit to receive IF signals, one end of the second power detector is connected to the multiplexer of the control circuit, another end of the second power detector receives RF signals from the fourth sending power amplifier of the sending circuit.

6. The IF signal loss compensation circuit as claimed in claim 5, further comprising a clock circuit, the clock circuit comprising a fourth attenuator, a sixth band pass filter and a clock distribution device connected in series; the fourth attenuator is also connected to the indoor unit via the IF splitter of the outdoor unit, the clock distribution device is connected to the modem and the synthesizer, the fourth band pass filter is connected to the indoor unit via the IF splitter of the outdoor unit.

7. The IF signal loss compensation circuit as claimed in claim 1, wherein the outdoor unit is a base station of the network communication system, and the indoor unit is a hub of the network communication system.

8. The IF signal loss compensation circuit as claimed in claim 1, wherein the gain amplifications of the sending circuit and the receiving circuit are substantially equal.

9. The IF signal loss compensation circuit as claimed in claim 1, wherein the sending circuit outputs a (radio frequency) RF signal, the detection circuit further detects the RF signal in substantially real-time, the control circuit further determines signal loss in the sending circuit by comparing the RF signal detected by the detection circuit with another pre-stored signal, and compensates the signal loss in the sending circuit in substantially real-time by varying gain amplifications of the sending circuit and the receiving circuit according to the signal loss in the sending circuit.

10. The IF signal loss compensation circuit as claimed in claim 1, wherein the control circuit comprises a synthesizer, first and second oscillators, a multiplexer, an analog-to-digital converter, a controller, a modem, a fifth band pass filter, and a third attenuator connected in series; the third attenuator is also connected to the indoor unit via an IF splitter of the outdoor unit, the multiplexer is also connected to the controller, the controller is also connected to the synthesizer, and the sending circuit and the receiving circuit to vary gain amplifications of the sending circuit and the receiving circuit; one end of the first oscillator is connected to the sending circuit, and another end of the first oscillator is connected to the synthesizer, wherein the synthesizer is also connected to the receiving circuit via the second oscillator.

11. The IF signal loss compensation circuit as claimed in claim 10, wherein the detection circuit comprises a first power detector and a second power detector; one end of the first power detector is connected to the multiplexer of the control circuit, another end of the first power detector is connected to the sending circuit to receive IF signals, one end of the second power detector is connected to the multiplexer of the control circuit, another end of the second power detector receives RF signals from the sending circuit.

12. The IF signal loss compensation circuit as claimed in claim 1, wherein the detection circuit comprises a first power detector and a second power detector; one end of the first power detector is connected to the control circuit, another end of the first power detector is connected to the sending circuit to receive IF signals, one end of the second power detector is connected to the control circuit, another end of the second power detector receives RF signals from the sending circuit.

13. A wireless communication system, comprising:
an antenna;
an indoor unit generating an IF signal;
a cable; and
an outdoor unit, comprising:
a sending circuit connected to the antenna, wherein the sending circuit is connected to the indoor unit through the cable and receives an IF signal from the indoor unit through the cable;
a receiving circuit connected to the antenna, wherein the receiving circuit is connected to the indoor unit through the cable;
a detection circuit detecting the IF signal received by the sending circuit in substantially real-time; and
a control circuit determining signal loss in the cable by comparing the IF signal detected by the detection circuit with a pre-stored signal corresponding to the IF signal, and compensates the signal loss in the cable in substantially real-time by varying gain amplifications of the sending circuit and the receiving circuit according to the determined signal loss in the cable.

* * * * *